Nov. 1, 1966 M. TISCHLER 3,282,755
METHOD OF MAKING PLASTIC EMBEDDED COLOR-CODED PRINTED CIRCUIT
Original Filed May 29, 1961
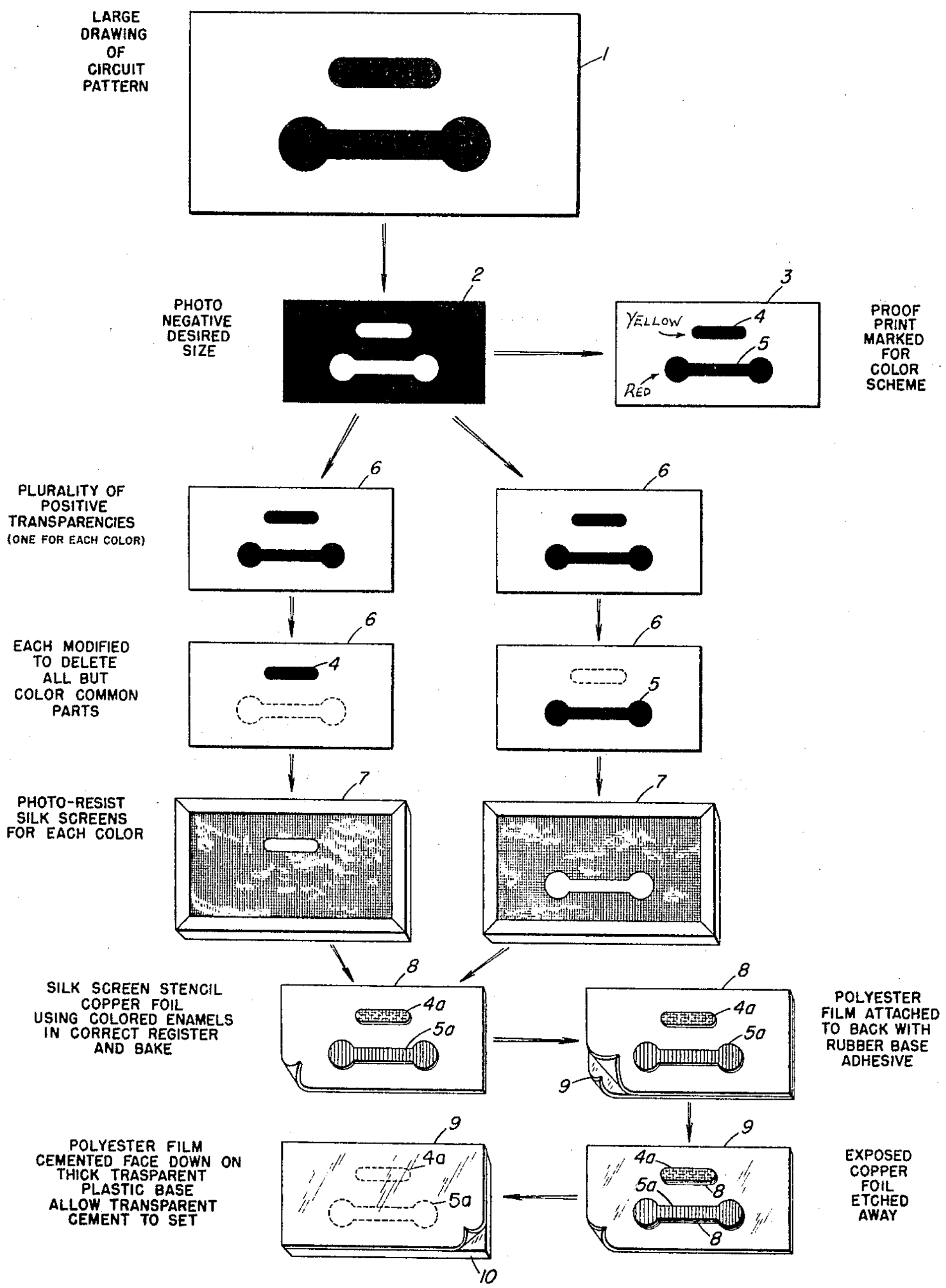
STRIP OFF & DISCARD POLYESTER FILM
CIRCUIT PATTERN REMAINS FLUSH
EMBEDDED IN BASE — COPPER SIDE OUT
MORRIS TISCHLER
INVENTOR
BY Walter G. Finch
ATTORNEY 3,282,755
Patented Nov. 1, 1966

3,282,755

METHOD OF MAKING PLASTIC EMBEDDED COLOR-CODED PRINTED CIRCUIT

Morris Tischler, Baltimore, Md., assignor to Electronic Aids, Inc., Baltimore, Md., a corporation of Maryland Continuation of application Ser. No. 113,508, May 29, 1961. This application June 14, 1965, Ser. No. 470,266
2 Claims. (Cl. 156—3)

This invention relates to electric conductors, and more particularly it pertains to a printed circuit article and process for manufacture thereof. This patent application is a continuation of U.S. patent application Serial No. 113,508 filed May 29, 1961 by applicant for "Plastic Embedded Color-Coded Printed Circuit," now abandoned.

It is common practice in electronic apparatus to use colored wiring to facilitate the tracing of individual circuits. With the advent of printed circuitry, this color coding becomes even more desirable because of the involved paths by which circuits are routed in order to avoid crossovers. Then too, it is of great importance in the educational field to be able to explain circuit wiring of exhibition apparatus by reference to colors.

Accordingly, it is a principal object of this invention to provide a process for manufacturing plastic embedded color coded printed circuits.

Another object of this invention is to provide a circuit board having a solderable flush embedded printed wiring pattern.

Still another object of this invention is to provide a protected printed circuit board which is both functional and decorative.

Yet another object of this invention is to provide colored printed circuit elements which are readily transferable to base structure thus protecting the base structure from etching fluids.

And still another object of the invention is to provide a circuit base for electronic apparatus which is easily traced by colors observable from the reverse side.

These and other objects and attendant advantages of this invention will become more readily apparent and understood from the following detailed specification and single sheet of accompanying drawings.

As shown in the drawing, the desired circuit is first laid out by an artist on a large scale drawing 1. A photo negative 2 is then made to the desired size of this large scale drawing 1.

From the photo negative, a proof print 3 is taken as well as a plurality of contact positive transparencies 6 equal in number to the different colors to be used.

The proof print 3 is marked as a guide to the colors desired, for example, the character image 4 to be yellow and the character image 5 to be red. Each positive transparency 6 is mechanically modified to delete all but the desired color common parts or characters.

Next, by a well-known photo-resist process, silk screen stencils 7 are made from each color-common modified positive transparency 6. Then using these stencils 7 sequentially in correct register colored enamel characters such as yellow enamel character **4*a* and red enamel characters 5*a* are applied to a common sheet of degreased copper foil 8** and baked for one-half hour at 140 degrees F.

A preferred enamel for this purpose includes a catalyst type silk screen ink with an added epoxy resin bonding agent. For example, uniglaze enamel with bonding agent Omega Research No. 803 has been found to be very successful. The degreasing of the copper foil 8 is best carried out in an ammonium persulphate solution which is effective in removing organic contamination.

A thin polyester film 9, such as mylar is now attached to the back of the stenciled and baked foil 8 using a rubber base adhesive and the assembly placed in an etching bath. All exposed copper is then dissolved away to the adhesive covered polyester film 9.

The yellow and red colored characters **4*a* and 5*a* remain unchanged but now have an underlying replica of themselves of copper foil 8 and are still positioned relative to each other on the polyester film 9**.

This polyester film 9 is now cemented, character face down, onto a thick transparent plastic base 10 with a transparent cement suited to the plastic base material. For example, if plexiglass is chosen the most suitable cement would be Masco acrylic resin No. MC18.

After the cement has set and hardened, the polyester film 9 is stripped off and discarded. The characters **4*a* and 5*a* will be found flush embedded in the base 10 with the copper foil side exposed. The color side of each character 4*a* and 5*a*** clearly shows through the transparent plastic and is protected against smudging from the fingers of a student or repairman.

The customary operations of drilling, eyeletting and soldering-in of components may be carried out through well-known techniques for ordinary printed circuits. It should be noted that the plastic base 10 is never exposed to etching fluids, thus preserving its dielectric property at a high level.

Obviously many modifications and variations of the present process and article of this invention are possible in light of the above teachings. It is, therefore, to be understood that within the scope of the appended claims the invention may be practiced otherwise than as specifically described.

What is claimed is:

1. A process for manufacturing a plastic embedded colored printed circuit pattern, comprising, applying colored enamel characters to a sheet of degreased copper foil, baking said sheet, attaching a thin flexible film to the back of said baked copper foil using an adhesive, etching said backed copper foil to dissolve the exposed copper and expose said thin flexible film with the colored characters remaining unchanged but having underlying replica of themselves of said copper foil and positioned relative to each other on said thin flexible film, cementing said thin flexible film character face down to a transparent plastic base material, and subsequently removing said thin flexible film, with said characters remaining embedded in said plastic base material with the copper foil side exposed and the colored characters visible on the reverse side thereof.

2. A process for manufacturing a plastic embedded colored printed circuit pattern, comprising, laying out a desired circuit pattern, making a photographic negative of a circuit pattern to the desired scale, making a plurality of contact positive transparencies from said photographic negative corresponding in number to the colors to be used in said printed circuit pattern, modifying each of said contact positive transparencies to delete all but the desired color common parts, making silk screen stencils of said color common modified positive transparencies, using said silk screen stencils sequentially in correct register to apply colored enamel characters to a common sheet of degreased copper foil, baking said sheet, attaching a polyester film to the back of the stenciled and baked copper foil using a rubber base adhesive, etching said polyester backed copper foil to dissolve the exposed copper and expose said adhesive covered polyester film with the colored characters remaining unchanged but having underlying replica of themselves of said copper foil and positioned relative to each other on said polyester film, cementing said polyester film character face down on to a transparent plastic base material, and subsequently removing said polyester film, with said characters remaining flush embedded in said plastic base material with the copper foil side exposed and the colored characters exposed on the reverse side thereof.

References Cited by the Examiner

UNITED STATES PATENTS

| | | | |
|---|---|---|---|
| 2,438,006 | 3/1948 | Gustafson | 174—112 |
| 2,441,960 | 5/1948 | Eisler | 156—3 |
| 2,458,439 | 1/1949 | Staehle | 156—3 |
| 2,628,998 | 2/1953 | Frisbie | 174—112 |
| 2,692,190 | 10/1954 | Pritikin | 156—3 |
| 2,888,336 | 5/1959 | Padgett | 156—3 |
| 3,135,823 | 6/1964 | Pritikin | 156—3 |

EARL M. BERGERT, *Primary Examiner.*

HAROLD ANSHER, *Examiner.*